(12) United States Patent
Min et al.

(10) Patent No.: US 9,832,856 B2
(45) Date of Patent: Nov. 28, 2017

(54) CIRCUIT BOARD

(71) Applicant: Samsung Electro-Mechanics Co., Ltd., Suwon-si (KR)

(72) Inventors: Tae-Hong Min, Hwaseong-si (KR); Myung-Sam Kang, Hwaseong-si (KR); Young-Gwan Ko, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/002,720

(22) Filed: Jan. 21, 2016

(65) Prior Publication Data
US 2016/0302298 A1    Oct. 13, 2016

(30) Foreign Application Priority Data
Apr. 8, 2015 (KR) .................. 10-2015-0049568

(51) Int. Cl.
*H05K 1/00* (2006.01)
*H05K 1/02* (2006.01)
*H05K 3/46* (2006.01)

(52) U.S. Cl.
CPC ......... *H05K 1/0204* (2013.01); *H05K 3/4608* (2013.01); *H05K 1/0207* (2013.01); *H05K 1/0218* (2013.01); *H05K 1/0271* (2013.01); *H05K 2201/0323* (2013.01); *H05K 2201/0338* (2013.01); *H05K 2201/066* (2013.01); *H05K 2201/10416* (2013.01)

(58) Field of Classification Search
CPC ... H05K 1/00; H05K 1/02; H05K 1/11; H05K 1/18; H05K 1/206; H05K 3/00; H05K 3/10; H05K 3/20; H05K 3/30; H05K 3/42; H05K 7/20; H01L 23/34; H01L 23/42; H01L 23/48; H01L 23/58; H01L 23/367
USPC .......... 174/54, 260, 264, 523, 526; 361/699, 361/702, 704, 708, 720; 257/774
See application file for complete search history.

(56) References Cited

U.S. PATENT DOCUMENTS

| | | | | |
|---|---|---|---|---|
| 4,396,936 A | * | 8/1983 | McIver | H01L 23/3736 174/252 |
| 5,200,809 A | * | 4/1993 | Kwon | H01L 23/367 257/707 |
| 5,266,748 A | * | 11/1993 | Kawakami | H05K 1/0218 174/260 |
| 5,590,462 A | * | 1/1997 | Hundt | H01L 23/3677 174/523 |
| 5,831,826 A | * | 11/1998 | Van Ryswyk | H05K 1/0206 165/185 |
| 6,331,731 B1 | * | 12/2001 | Kelly | H01L 23/04 257/704 |

(Continued)

FOREIGN PATENT DOCUMENTS

| | | |
|---|---|---|
| JP | 11-284300 A | 10/1999 |
| JP | 2000-349435 A | 12/2000 |
| KR | 10-0976201 B1 | 8/2010 |

*Primary Examiner* — Xiaoliang Chen
(74) *Attorney, Agent, or Firm* — NSIP Law

(57) ABSTRACT

Disclosed are a circuit board and a method of manufacturing the same. The circuit board includes an insulating part, a heat-transfer body disposed in the insulating part, the heat-transfer body including a thermally conductive material formed in a column shape, and a function hole penetrating the heat-transfer body between a top surface and a bottom surface of the heat-transfer body.

8 Claims, 7 Drawing Sheets

(56) References Cited

U.S. PATENT DOCUMENTS

| | | | | |
|---|---|---|---|---|
| 6,335,862 B1* | 1/2002 | Koya | H01L 23/3677 | 174/252 |
| 6,430,047 B2* | 8/2002 | Wentzel | G01R 1/0408 | 165/80.3 |
| 6,964,874 B2* | 11/2005 | Werner | H01L 21/2885 | 257/E21.175 |
| 7,190,581 B1* | 3/2007 | Hassani | H01L 23/3677 | 165/80.3 |
| 7,606,038 B2* | 10/2009 | Sugimura | H05K 1/0206 | 257/706 |
| 8,166,650 B2* | 5/2012 | Thomas | H05K 1/0206 | 228/180.22 |
| 8,248,803 B2* | 8/2012 | Lin | H01L 23/3677 | 165/104.33 |
| 2001/0030059 A1* | 10/2001 | Sugaya | H01L 21/56 | 174/256 |
| 2003/0169575 A1* | 9/2003 | Ikuta | H01L 23/3677 | 361/761 |
| 2003/0214047 A1* | 11/2003 | Noguchi | H01L 22/32 | 257/774 |
| 2004/0234696 A1* | 11/2004 | Hongo | C23C 18/1619 | 427/328 |
| 2007/0165385 A1* | 7/2007 | Park | G11B 25/043 | 361/748 |
| 2008/0017402 A1* | 1/2008 | Huang | H05K 1/0206 | 174/252 |
| 2008/0130234 A1* | 6/2008 | Maehara | G06F 1/203 | 361/704 |
| 2009/0109624 A1* | 4/2009 | Chan | H05K 1/0206 | 361/702 |
| 2009/0207630 A1* | 8/2009 | Satoh | G02B 6/0085 | 362/615 |
| 2009/0211788 A1* | 8/2009 | Yanbe | H05K 1/0206 | 174/252 |
| 2009/0294165 A1* | 12/2009 | Thomas | H05K 1/0206 | 174/263 |
| 2010/0039775 A1* | 2/2010 | Lima | H05K 1/0207 | 361/709 |
| 2010/0263915 A1* | 10/2010 | Shiraiwa | H05K 1/0201 | 174/252 |
| 2011/0058372 A1* | 3/2011 | Lerman | F21V 29/70 | 362/235 |
| 2013/0168136 A1* | 7/2013 | Inaba | H05K 1/0201 | 174/252 |
| 2016/0120060 A1* | 4/2016 | Kim | H05K 3/4038 | 361/720 |
| 2016/0302299 A1* | 10/2016 | Lee | H05K 1/0206 | |

* cited by examiner

CIRCUIT BOARD

CROSS-REFERENCE TO RELATED APPLICATION(S)

This application claims the benefit under 35 USC §119(a) of Korean Patent Application No. 10-2015-0049568, filed with the Korean Intellectual Property Office on Apr. 8, 2015, the entire disclosure of which is incorporated herein by reference for all purposes.

BACKGROUND

1. Field

The following description relates to a circuit board.

2. Description of Related Art

To address today's electronic devices that are increasingly lighter, smaller, faster, have more functions, and provide higher performances, various multilayered board technologies have been developed by forming a plurality of wiring layers on a circuit board, such as, for example, a printed circuit board (PCB). Some of these technologies have evolved to install electronic components, such as, for example, active devices or passive devices, in the multilayered board.

An increased amount of heat is generated, as application processors (AP) are connected to the multilayered board, have more functions, and provide higher performances.

The related arts of the present invention are disclosed in Korean Patent No. 10-0976201, Japan Publication No. 2000-349435 and Japan Publication No. 1999-284300. All documents cited in the present disclosure, including published documents, patent applications, and patents, may be incorporated herein in their entirety by reference in the same manner as when each cited document is separately and specifically incorporated or incorporated in its entirety.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An aspect of the present disclosure provides a circuit board having at least one of an improved heat-dissipating performance, a reduced warpage, an improved reliability, and an improved manufacturing efficiency.

In one general aspect, there is provided a circuit board including a heat-transfer body made of a material having a high thermal conductivity, and a heat from a high-temperature portion may be rapidly moved through this heat-transfer body. The heat-transfer body has a function hole formed therein, and an insulating material may be filled in the function hole.

In another general aspect, there is provided a circuit board including an insulating part, a heat-transfer body disposed in the insulating part, the heat-transfer body including a thermally conductive material formed in a column shape, and a function hole penetrating the heat-transfer body between a top surface and a bottom surface of the heat-transfer body.

The insulating material may be filled in the function hole.

The insulating material may be integrally formed with the insulating part.

The function hole may be formed near a center of the heat-transfer body.

A position of the function hole may be determined based on a direction or severity of a warpage of a portion of circuit board where the first heat-transfer body is to be placed.

The circuit may include a first surface of a first via in contact with a top surface of the heat-transfer body, a first metal pattern in contact with a second surface of the first via, and a first coupling member connected to the first metal pattern.

The first coupling member may be connectable with a first electronic component, and the first electronic component may include a first area and a second area, the second area having a higher temperature than the first area during an operation.

At least a portion of the heat-transfer body may be placed vertically below the first electronic component.

An area of a top surface of the heat-transfer body may correspond to a width of the second area of the first electronic component.

The circuit board may including a second via having a surface in contact with a bottom surface of the heat-transfer body, a second metal pattern in contact with another surface of the second via, and a second coupling member connected to the second metal pattern, wherein a heat from the heat-transfer body moves to the second coupling member through the second via and the second metal pattern.

A primer layer may be formed on a surface of the heat-transfer body, the primer layer being configured to adhere the heat-transfer body to the insulating part.

A primer may be formed on a surface of the heat-transfer body, and the first via may penetrate the primer to be in contact with the top surface of the heat-transfer body.

In another general aspect, there is provided a circuit board including insulating layers, metal layers formed on the insulating layers, vias penetrating at least one of the insulating layers and connecting at least two of the metal layers, pads connected with a first electronic component formed on an outermost metal layer, the first electronic component including a first area and a second area having a higher temperature than the first area during an operation, a core part having a cavity, the core part formed in the insulating layers, a heat-transfer body being at least partially inserted in the cavity and made of a thermally conductive material, and an insulating layer of the insulating layers covering the heat-transfer body and the core part, wherein the heat-transfer body is formed in a column shape having a top surface and a bottom surface, a function hole penetrates the heat-transfer body between the top surface and the bottom surface, and a material forming the insulating layer is filled in the function hole.

The circuit board may include a first surface of a first via in contact with a top surface of the heat-transfer body, a first metal pattern in contact with a second surface of the first via, and a first coupling member connected to the first metal pattern, wherein the first coupling member is connectable with the first electronic component.

The circuit board may include a second via having a surface in contact with a bottom surface of the heat-transfer body, a second metal pattern in contact with another surface of the second via, and a second coupling member connected to the second metal pattern, wherein a heat from the first electronic component moves to the second coupling member through the first coupling member, the first metal pattern, the first via, the heat-transfer body, the second via and the second metal pattern.

A distance from the second area to the first coupling member is smaller than a distance from the first area to the first coupling member.

The pads may include a first pad through which the heat passes and a second pad through which an electric signal passes, and the first coupling member is formed to be connectable with the first pad, and a conductor connected with the second pad is not connected to the heat-transfer body.

In another general aspect, there is provided a method of manufacturing a heat-transfer body including preparing a metal plate, forming a resist layer on the metal plate, patterning the resist layer to correspond to a shape of the heat-transfer body, etching the metal plate to form a hole with a connecting portion, disposing the etched metal plate on a second plate, and removing the connecting portion to form a function hole.

A lateral surface of the heat-transfer body may have a cross section in the shape of an hourglass.

The etching of the metal plate may include etching the metal plate from two opposing directions to form a cross section in the shape of an hourglass.

In an embodiment, the heat-transfer body may be made of a metallic material such as, for example, copper. In another embodiment, the heat-transfer body may be made of a non-metallic material having a high thermal conductivity such as, for example, graphite or graphene.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
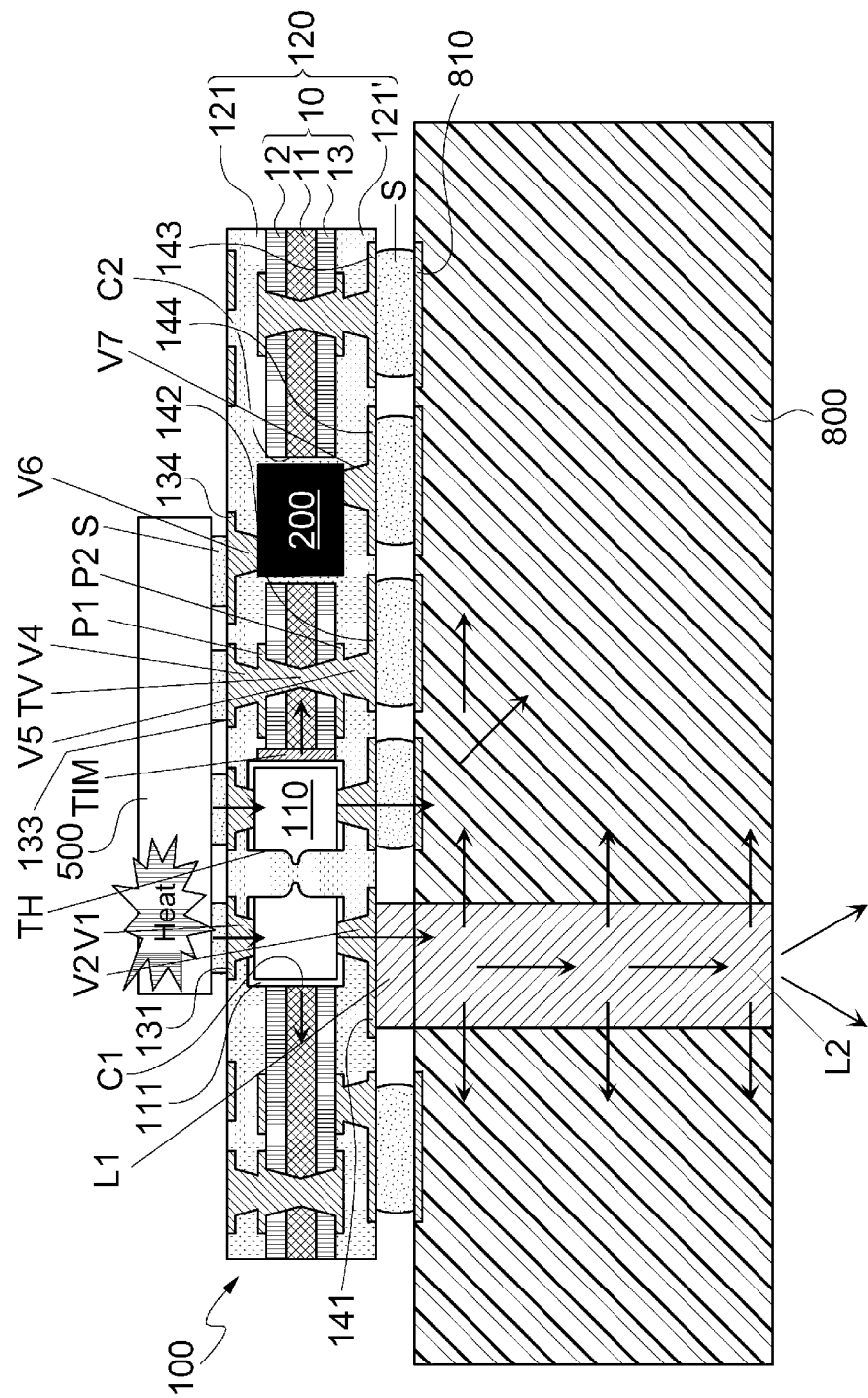
FIG. 1 is a diagram illustrating an example of a circuit board.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Terms such as "first" and "second" can be used in merely distinguishing one element from other identical or corresponding elements, but the above elements shall not be restricted to the above terms.

It will be understood that when an element or layer is referred to as being "on", "coupled", or "connected to" another element or layer, it can be directly on or connected to the other element or layer or through intervening elements or layers may be present. In contrast, when an element is referred to as being "directly on", "directly coupled to", or "directly connected to" another element or layer, there are no intervening elements or layers present. Like reference numerals refer to like elements throughout. As used herein, the term "and/or" includes any and all combinations of one or more of the associated listed items.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below.

Figure 2:
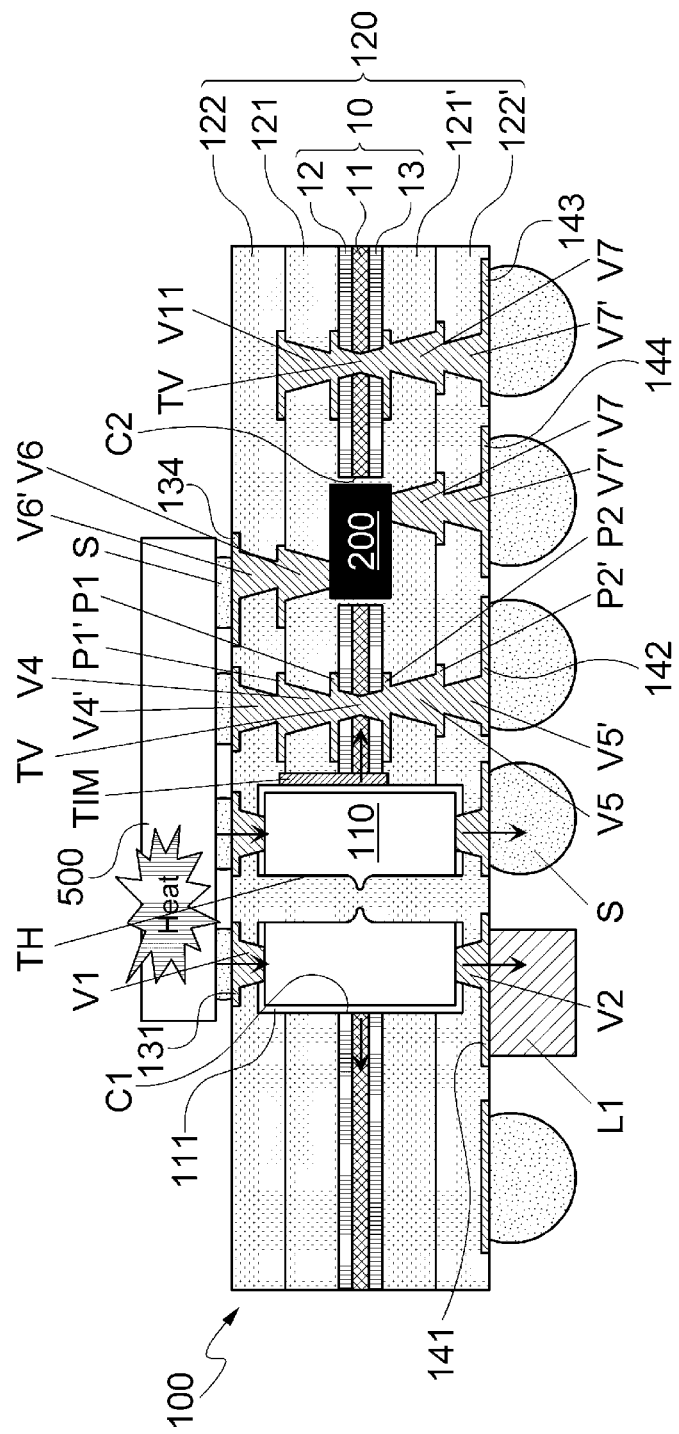
FIG. 2 is a diagram illustrating an example of a circuit board.
Figure 3:
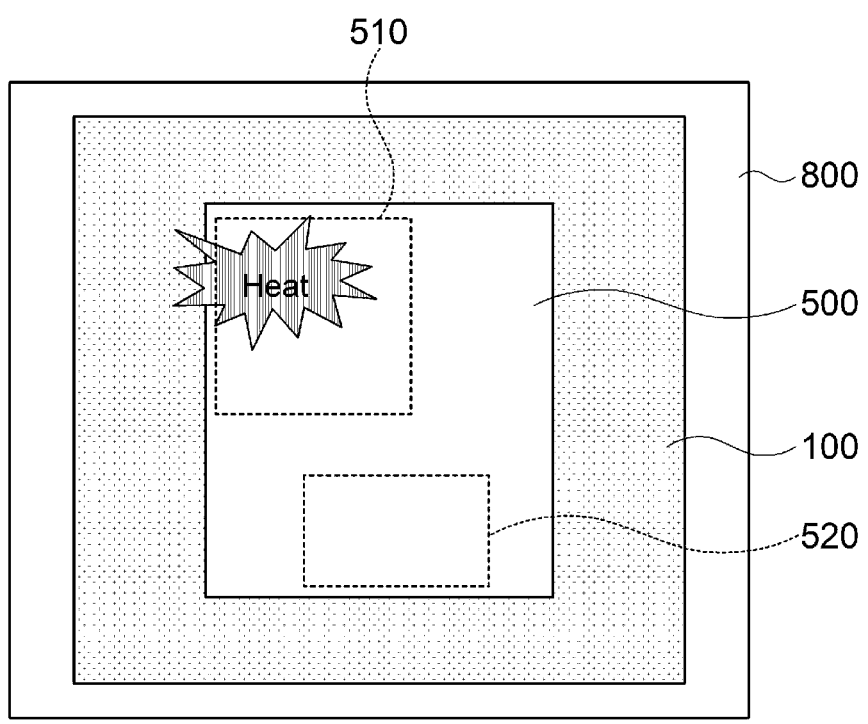
FIG. 3 is a diagram illustrating an example of the circuit board.
Figure 4:
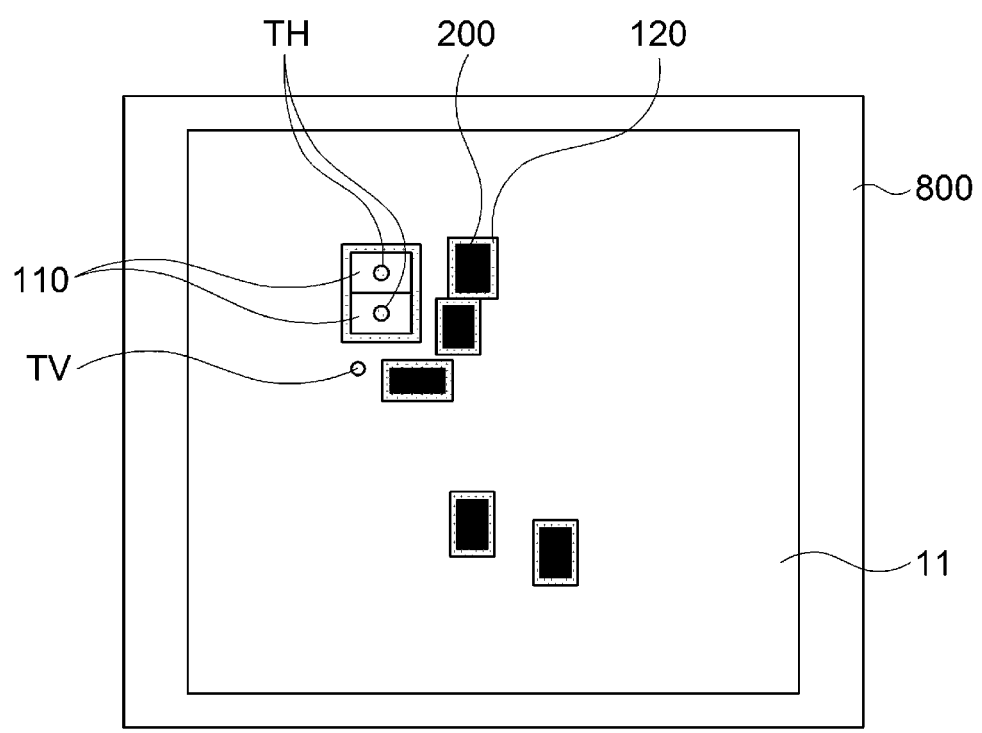
FIG. 4 is a diagram illustrating an example of the circuit board.
Figure 5:
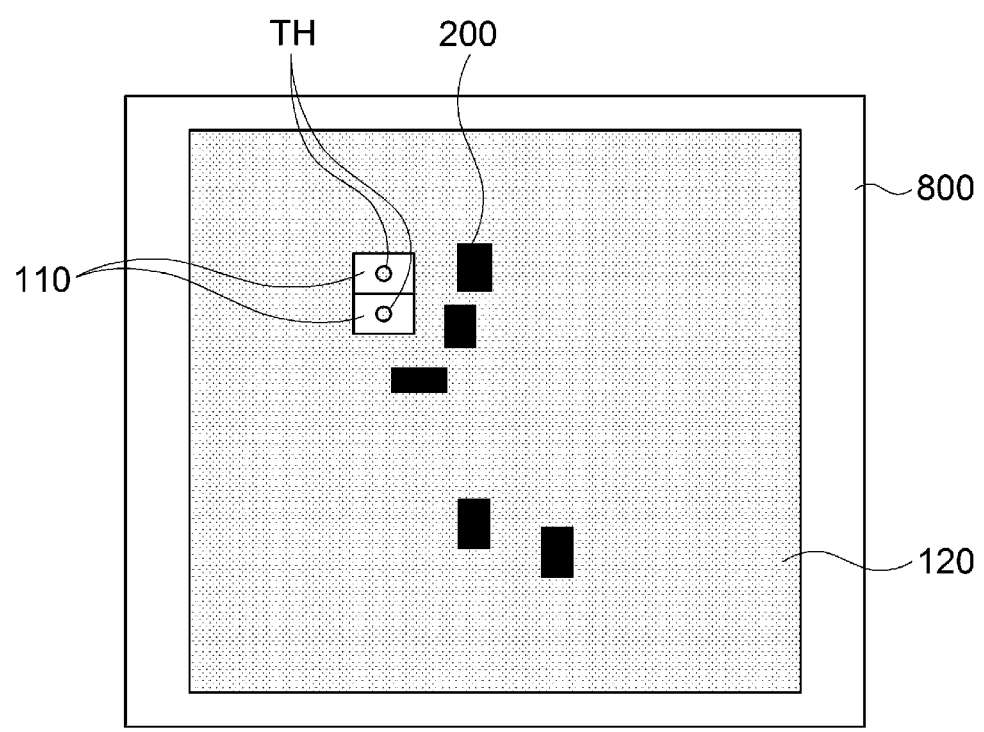
FIG. 5 is a diagram illustrating an example of the circuit board.

FIG. 1 is a diagram illustrating an example of a circuit board 100. FIG. 2 is a diagram illustrating an example of a circuit board 100. FIG. 3 is a diagram illustrating an example of the circuit board 100. FIG. 4 is a diagram illustrating an example of the circuit board 100. FIG. 5 is a diagram illustrating an example of the circuit board 100.

The circuit board 100 includes a first heat-transfer body 110, which is inserted in an insulating part 120. In an example, the first heat-transfer body 110 is made of a material having a high thermal conductivity, and the first heat-transfer body 110 is formed in a lump shape. In an example, the first heat-transfer body 110 may be formed in a column shape with a circular, elliptical or polygonal base, including a top surface and a bottom surface. Moreover, the first heat-transfer body 110 may be made of a metallic material, such as, for example, copper. In another example, the first heat-transfer body 110 may be made of a non-metallic material having a high thermal conductivity, such as, for example, graphite or graphene.

The first heat-transfer body 110 has a function hole TH. In an example, the function hole TH is a through-hole that extends from the top surface to the bottom surface of the first heat-transfer body 110. The function hole TH may carry out a function of buffering a warpage that may be occur by thermal variation exerted to the circuit board 100 while manufacturing or while the circuit board 100 is in use.

A conductive material and an insulating material included in the circuit board 100 may have different coefficients of thermal expansion. If a rapid change in temperature were made to the circuit board 100, the circuit board 100 might be warped due to the difference in contraction ratio or expansion ratio. This phenomenon is often called warpage. In this example, since the first heat-transfer body 110 included in the circuit board 100 includes the function hole TH penetrating heat-transfer body 110, a stress exerted around the first heat-transfer body 110 is absorbed at least partially by the function hole TH, thereby diminishing warpage.

The function hole TH may be filled with an insulating material. In an example, the insulating material filled in the function hole TH may be made of a same material as that of the insulating part 120 surrounding the first heat-transfer body 110. Accordingly, the insulating material filled in the function hole TH may be integrally formed with the insulating part 120 disposed on the top surface and the bottom surface of the first heat-transfer body 110, resulting in an improved adhesion between the first heat-transfer body 110 and the insulating part 120.

Moreover, when the first heat-transfer body 110 is made of graphite or graphene, the function hole TH having with the insulating material may improve an interlayer adhesion of the graphite or graphene.

The function hole TH may be formed near a center of the first heat-transfer body 110 to further provide the buffering effect and maximize the adhesion with the insulating part 120.

In another example, a position of the function hole TH may be determined by considering a direction or severity of the warpage of an area the circuit board 100 where the first heat-transfer body 110 is to be placed.

If a diameter of the function hole TH is too large, the first heat-transfer body 110 would not have a sufficient heat-transferring performance. If the diameter of the function hole TH is too small, the warpage diminishing function and the adhesion improvement function would be deteriorated.

In another example, the first heat-transfer body 110 may have a primer layer 111 formed on a surface thereof. The primer layer 111 may function to improve the adhesion between the insulating part 120 and the first heat-transfer body 110. In an example, the primer layer 111 may be made of a primer containing isopropyl alcohol and silane. The silane may include, for example, acrylic silane, epoxy silane, imidazole silane, or mercapto silane.

In another example, the primer layer 111 may be made of 3-(trimethoxysilyl)propylmethacrylate (MPS), and may have a silane additive added thereto.

The insulating part 120 may be constituted with a single insulating layer or a plurality of insulating layers. In an example, as illustrated in FIG. 1, the insulating part 120 is constituted with 3 insulating layers 10, 121, 121', and the insulating layer positioned in a center portion is a core part 10, the present disclosure is not restricted thereto.

In an example, the first heat-transfer body 110 is placed in a middle of the insulating part 120. In the case where the core part 10 is provided as illustrated in FIGS. 1 and 2, a cavity C1 may be formed to penetrate the core part 10, and the first heat-transfer body 110 may be inserted in the cavity C1.

In an example, vias formed in the insulating part 120 may be in contact with the first heat-transfer body 110. A via placed above the first heat-transfer body 110 will be referred to as a first via V1, and a via placed below the first heat-transfer body 110 will be referred to as a second via V2. In an example, one or more metal patterns may be disposed in the insulating part 120, and a metal pattern being in contact with the first via V1 will be referred to as a first metal pattern 131, and a metal pattern being in contact with the second via V2 will be referred to as a second metal pattern 141. A fourth via V4 and a fifth via V5 may be disposed in the insulating part 120. A metal pattern being in contact with one end of the fourth via V4 will be referred to as a third metal pattern 133, and a metal pattern being in contact with the other end of the fifth via V5 will be referred to as a fourth metal pattern 142.

In an example, the first heat-transfer body 110 may store heat, and the heat storage may be enhanced as a volume of the first heat-transfer body 110 is increased. Accordingly, as illustrated in FIG. 1, the first heat-transfer body 110 may be formed in a column shape. As the first heat-transfer body 110 is formed in a column shape, it is possible to maximize the volume of the first heat-transfer body 110 for a given area of the bottom surface. Moreover, forming the top surface and the bottom surface in a polygonal shape, especially in a rectangular shape, would be better suited for the electronic component 500, which is increasingly smaller, and the circuit board 100, which is increasingly smaller and has a finer pattern pitch, than forming the top surface and the bottom surface in a circular or elliptical shape. Moreover, as illustrated, the volume of the first heat-transfer body 110 is greater than the volume of a general via, such as the first to seventh vias V1-V7. The first heat-transfer body 110 may have a multiple number of vias contacted its surfaces, particularly the top or bottom surface. Not only is the area of the top or bottom surface of the first heat-transfer body 110 greater than that of the general via, but the overall volume of the first heat-transfer body 110 is at least twice that of the general via. Accordingly, it is possible to quickly absorb the heat from a heat source and disperse the absorbed heat through a different path connected with the first heat-transfer body 110. Moreover, by increasing a thickness of the first heat-transfer body 110, a distance between the first heat-transfer body 110 and a hot spot may be reduced, shortening a time required for the heat of the hot sport to move to the first heat-transfer body 110.

In an example, a first electronic component 500 may be installed on one side of the circuit board 100. Moreover, the circuit board 100 may be installed on one side of a supplemental board 800, such as a mainboard. In this example, the first electronic component 500 may be an application processor (AP) and may generate heat during an operation.

In an example, the heat generated by the first electronic component 500 is higher at a certain portion of the first electronic component 500. Such a portion is often referred to as a "hot spot." The hot spot may be formed at a particular area of the circuit board 100 or at a plurality of positions in the first electronic component 500. Moreover, the hot spot may be formed near a power source terminal of the first electronic component 500 or at an area of the first electronic component 500 where switching devices are relatively heavily concentrated.

In another example, the first electronic component 500 may include a region that has a relatively higher performance specification and a region that has a relatively lower performance specification. For instance, the first electronic component 500 may be constituted with a processor connected with cores having the clock speed of 1.8 GHz in one region thereof and a processor connected with cores having the clock speed of 1.2 GHz in another region thereof. Referring to FIG. 3, the first electronic component 500 may include a first region 510 and a second region 520. In this example, the first region 510 may perform a faster operation than the second region 520 and accordingly may consume a greater amount of electric power and generate a greater amount of heat than the second region 520.

The circuit board 100 has the first heat-transfer body 110 disposed at an area adjacent to the hot spot. Accordingly, the heat generated from the hot spot may be quickly transferred to the first heat-transfer body 110 and quickly dispersed to other regions of the circuit board 100 or to another device such as the mainboard, such as, for example, the supplemental board 800 shown in FIG. 1, coupled to the circuit board 100.

In an example, at least a portion of the first heat-transfer body 110 is placed at an area vertically below the first electronic component 500.

The circuit board 100 may further include a second electronic component 200, which may be a capacitor, an inductor or a resistor. When the first electronic component 500 is an application processor (AP), a capacitor, for example, may be connected to the first electronic component 500 to reduce a power noise. In such a case, the effectiveness of the power noise reduction increases with a decrease in the separation between the capacitor and the first electronic component 500. Accordingly, at least a portion of the second electronic component may be placed vertically below the first electronic component 500 to enhance the effect of power noise reduction.

In an example, most of the first heat-transfer body 110 may be placed at the area vertically below the first electronic component 500. The top surface of the first heat-transfer body 110 may have a smaller area than that of a top surface of the first electronic component 500. In an example, the area of the top surface of the first heat-transfer body 110 may be determined to correspond to a width of the hot spot of the first electronic component 500. Accordingly, the heat of the hot spot may be rapidly transferred to the first heat-transfer body 110. Therefore, not only is it advantageous for making the circuit board 100 lighter and minimizing a warpage, but the first heat-transfer body 110 may be disposed in the circuit board 100 more efficiently.

Most of the second electronic component 200 may be placed at an area vertically below the first electronic component 500. In this example, the second electronic component 200 may be placed in an area vertically below the first electronic component where the first heat-transfer body 110 is not placed. Moreover, the first heat-transfer body 110 may be place relatively closer to the hot spot than the second electronic component 200 is.

Referring to FIG. 1 to FIG. 4, it shall be understood that the first heat-transfer bodies 110 and the second electronic components 200 may be inserted into cavities C1 and C2 disposed in the core part 10. That is, the first cavity C1 and the second cavity C2 are disposed in the core part 10, and the first heat-transfer body 110 may be inserted in the first cavity C1, and the second electronic component 200 may be inserted in the second cavity 200. In another example the first heat-transfer bodies 110 and the second electronic components 200 may be adjacently disposed vertically below the first electronic component 500 and particularly that the first heat-transfer bodies 110 may be concentrated near the hot spot illustrated in FIG. 3. Moreover, a horizontal-sectional view is illustrated in FIG. 5 to show an example where the insulating part 120 does not include the core part 10.

Accordingly, the heat from the hot spot may be quickly moved while an effect of reducing a power noise caused by the second electronic component 200 is maximized.

In an example, the first electronic component 500 may be coupled to the circuit board by a solder S. In this example, the first electronic component 500 may be coupled with the first metal pattern 131, the third metal pattern 133 and a seventh metal pattern 134 by the solder S.

Moreover, the second metal pattern 141, the fourth metal pattern 142, a fifth metal pattern 143, and a sixth metal pattern 144 of the circuit board 100 may be connected to the supplemental board 800, such as, for example a mainboard, using the solder S. In an example, interposed between the second metal pattern 141 and the supplemental board 800 may be a third heat-transfer body L1, having a similar material and shape as that of the first heat-transfer body 110. For a speedy transfer of the heat from the first heat-transfer body 110 to the supplemental board 800, the second metal pattern 141 and the supplemental board 800 may be connected with each other using the third heat-transfer body L1 formed in a lump shape with a material having a greater thermal conductivity than the general solder S. Moreover, a heat-dissipating part L2 may be disposed in the supplemental board 800 for a speedy dispersion or dissipation of the heat from the third heat-transfer body L1. The heat-dissipating part L2 may be exposed toward a top surface of the supplemental board 800 and may also be exposed toward a bottom surface of the supplemental board 800 to improve an efficiency of heat dissipation.

In an example, a metal pattern is disposed on an outermost layer of the circuit board 100 and is connected with the first electronic component 500 or the supplemental board 800. The metal pattern may be referred to as a pad. Other kinds of metal patterns may be disposed on the outermost layer, and a solder resist layer (not shown) may be disposed on the outermost layer to protect these circuit patterns or the insulating part 120. In an example, the pads required to be connected with an external device may have at least a portion thereof exposed out of the solder resist layer. A coupling member such as the solder S or a wire (not shown) may be interposed between the exposed pads and the external device for physical coupling between the pads and the external device.

When the first to seventh metal patterns are exposed out of the insulating part 120, as illustrated in FIG. 1, the first to seventh metal patterns may be understood as the pads. Moreover, the metal patterns exposed out of the solder resist layer may have any of a variety of surface-treated layers, such as nickel-gold plated layer, formed on a surface.

Although not illustrated, an insulating layer covering an outer surface of the first metal pattern 131 and a pad formed on an outer surface of the insulating layer may be provided. The first metal pattern 131 and the pad may be connected with each other by a via penetrating the insulating layer. In other words, if necessary, a build-up layer including an insulating layer and a metal layer may be further provided. In such a case, the first metal pattern 131 is no longer a pad but may be connected through a pad and a via formed in an outermost metal layer of the circuit board 100.

Accordingly, the heat generated from the hot spot may be rapidly transferred to the supplemental board 800 through a route of the first metal pattern 131—the first via V1—the first heat-transfer body 110—the second via V2—the second metal pattern 141.

In the case where a terminal connected to the first metal pattern 131 among terminals of the first electronic component 500 is for transmitting and receiving a signal, a route including the first via V1, the first heat-transfer body 110, the second via V2 and the second metal pattern 141 may perform a signal transmitting function. In this example, a connection pad or terminals of the supplemental board 800 connected to the second metal pattern 141 may also perform the signal transmitting function.

When a terminal connected to the first metal pattern 131 among the terminals of the first electronic component 500 does not transmit and receive a signal, the route including the first via V1, the first heat-transfer body 110, the second via V2 and the second metal pattern 141 may be electrically connected with a separate ground terminal (not shown). In this example, the connection pad or terminals of the supplemental board 800 connected to the second metal pattern 141 may be electrically connected with the separate ground terminal, which may be disposed on at least one of the circuit board 100 and the supplemental board 800.

When a terminal connected to the first metal pattern 131 among the terminals of the first electronic component 500 is a power terminal, the route including the first via V1, the first heat-transfer body 110, the second via V2 and the second metal pattern 141 may be electrically connected with a separate power providing circuit (not shown). In this example, the connection pad or terminals of the supplemental board 800 connected to the second metal pattern 141 may be electrically connected with the separate power providing circuit, which may be disposed on at least one of the circuit board 100 and the supplemental board 800.

A terminal connected to the first metal pattern 131 among the terminals of the first electronic component 500 may be a dummy terminal, in which case the dummy terminal may function as a path for transferring the heat out of the first electronic component 500.

As described above, the terminals of the first electronic component 500 may be distinguished into the terminal for signal input/output, the terminal for power input/output and the terminal for heat displacement. In an example, a particular terminal may perform one or more specific function only. For example, while inputting and outputting a signal or power, the terminal may be utilized for discharging the heat. By allowing the terminals disposed in an area of the hot spot of the first electronic component 500 to function to discharge the heat, the heat of the hot spot will be discharged more quickly. The aforementioned coupling member is in contact with the terminals carrying out the heat discharging function. In this example, the coupling member in contact with the first metal pattern 131 is referred to as a first coupling member, and the coupling member in contact with the second metal pattern 141 is referred to as a second coupling member. By allowing the first coupling member to be in contact with the first metal pattern 131, movement of the heat between the hot spot and the first heat-transfer body 110 may be facilitated more readily. In an example, at least one terminal of the first electronic component 500 is electrically connected with the first heat-transfer body 110 may be the dummy terminal that carries out the heat discharging function only. In this example, if another terminal among the terminals of the first electronic component 500 that functions only to transmit a signal were connected to the first heat-transfer body 110, a phenomenon of signal loss could occur. Accordingly, the terminal for signal transmission only may be kept from making an electrical connection with the first heat-transfer body 110. In other words, any via or circuit pattern connected to a pad that is connected to the terminal of the first electronic component 500 for signal transmission only may not be electrically connected to the first heat-transfer body 110.

Referring to FIG. 1 to FIG. 5, the circuit board 100 may include the core part 10. The core part 10 may reinforce a rigidity of the circuit board 100 to mitigate a problem of warpage. Moreover, by having a material with a high thermal conductivity contained in the core part 10, the heat generated from a local area, such as the hot spot, may be quickly dissipated to another portion of the circuit board 100, alleviating a problem caused by overheating.

The core part 10 may have a first upper insulating layer 121 formed on an upper surface thereof and a first lower insulating layer 121' on a lower surface thereof. Moreover, as illustrated in FIG. 2, the core part 10 may further have a second upper insulating layer 122 and a second lower insulating layer 122' formed thereon.

In an example, a second heat-transfer body may be included in the core part 10. For instance, the core part 10 may include a first core layer 11 made of graphite or graphene. In this example, graphite or graphene is thermally conductive in a direction of an XY plane, which is a plane parallel to top and bottom surfaces of the circuit board, hence capable of diffusing the heat effectively and rapidly.

In an example, the second heat-transfer body may be in direct contact with a lateral surface of the first heat-transfer body 110. For instance, a lateral surface of the second heat-transfer body may be exposed to the first cavity C1 disposed in the core part 10, and the first heat-transfer body 110 may be in contact with the first cavity C1. In another embodiment, a material having a high thermal conductivity may be interposed in an area between the second heat-transfer body and the first heat-transfer body 110. In this example, the material having a high thermal conductivity may be a thermal interface material (TIM). The TIM may comprise a material such as, for example, a polymer-metal composite material, a ceramic composite material, or a carbon composite material. For instance, the TIM may be a material having epoxy and carbon fiber filler mixed therein (with a thermal conductivity of about 660 W/mk), silicon nitride ($Si_3N_4$, with a thermal conductivity of about 200~320 W/mk) or epoxy and boron nitride (BN, with a thermal conductivity of about 19 W/mk). Accordingly, the heat transferred to the first heat-transfer body 110 may be not only moved in a vertical direction but also rapidly dissipated in a horizontal direction through the second heat-transfer body.

As the first heat-transfer body 110 and the second heat-transfer body are in direct contact with each other or are connected with each other by the TIM, the heat from the first electronic component 500 may be quickly moved to the first heat-transfer body 110 and then dissipated more rapidly than if the heat is transferred downwardly only. Moreover, as the heat can be distributed more evenly throughout the circuit board 100, compared to having the temperature excessively elevated in a particular area such as the hot spot, temperature deviations among various components or element installed in the circuit board 100 may be lessened, thereby improving the reliability. Furthermore, as the heat is quickly dissipated throughout the circuit board 100, the entire circuit board 100 may function as a kind of heat-dissipating plate, resulting in an increasing a heat-dissipating area.

In an example, the core part 100 may have a first circuit pattern P1 and a second circuit pattern P2 formed, respectively, on the surfaces of the core part 100. The first circuit pattern P1 and the second circuit pattern P2 may be electrically connected with each other by a through-via TV. The first circuit pattern P1 may be connected with the third metal pattern 133 by the fourth via V4, and the second circuit pattern P2 may be connected with the fourth metal pattern 142 by the fifth via V5. The third metal pattern 133 may be connected with the first electronic component 500 by the solder S, and the fourth metal pattern 142 may be connected with a connection pad 810 of the supplemental board 800 by the solder S. Accordingly, it is possible to provide a path for transmitting and receiving an electric signal between the first electronic component 500 and the supplemental board 800.

The first core layer 11 may have a second core layer 12 formed on one surface of first core layer 11, and a third core layer 13 formed on the other surface of the first core layer 11. In an example, at least one of the second core layer 12 and the third core layer 13 may be made of an insulating material, such as a prepreg. In another example, the second core layer 12 and the third core layer 13 may be made of a metal such as, for example, copper or invar. In another example, the first core layer 11 may be made of invar, and the second core layer 12 and the third core layer 13 may be made of copper. If one of the second core layer 12 and the third core layer 13 is made of a conductive material, a signal may be transmitted through an unintended route because the first circuit pattern P1 or the second circuit pattern P2 is formed on the surface of the core part 10, and thus means for providing an insulation may be formed on the surface of the core part 10.

In an example, the second electronic component 200 is inserted in the second cavity C2 of the core part 10. The second electronic component 200 may be connected with the seventh metal pattern 134 by the sixth via V6 and connected with the sixth metal pattern 144 by the seventh via V7. The second electronic component 200 may be a passive device, such as an inductor or a capacitor. In another example, second electronic component 200 may be an active device such as an integrated circuit. When the second electronic component 200 is a capacitor, a terminal of the first electronic component 500 connected with the seventh metal pattern 134 may be a power terminal. In other words, the second electronic component 200 may be installed as a decoupling capacitor to reduce a power noise of the first electronic component 500.

A reduction in the distance between the second electronic component 200 and the first electronic component 500, increases the effectiveness of the noise reduction effect. Accordingly, in an example of the circuit board 100, at least a portion of the second electronic component 200 is placed vertically below the first electronic component 500.

Although not illustrated, the core part 10 may have a recess, having a portion of the core part 10 caved in, may be formed therein instead of the cavity penetrating the core part 10, and the first heat-transfer body 110 or the second heat-transfer body 200 may be inserted in this recess.

Referring to FIG. 1, when the primer layer 111 is formed on the surface of the first heat-transfer body 110, the first via V1 and the second via V2 may penetrate the primer layer 111 to be in direct contact with the first heat-transfer body 110. Accordingly, it is possible to minimize any deterioration of the heat-transferring performance caused by the primer layer 111. In the examples shown in the drawing figures, the primer layer 111 is illustrated with an exaggerated thickness for convenience of understanding. However, the primer layer 111 is actually realized in the form of a thin film and thus may have a much smaller thickness than illustrated. Accordingly, it shall be understood that the primer layer 111 is illustrated in an exaggerated fashion. It appears in FIG. 1 that a lower surface of the primer layer 111 is placed on a same plane as the second circuit pattern P2 and thus that the bottom surface of the first heat-transfer body 110 is positioned slightly higher than the second circuit pattern P2. However, since the primer layer 111 has a minute thickness, compared to thicknesses of the second circuit pattern P2 or the first heat-transfer body 110, the thickness of the primer layer 111 may be ignored in understanding the positional relations of the first heat-transfer body 110 and the second circuit pattern P2.

Figure 6:
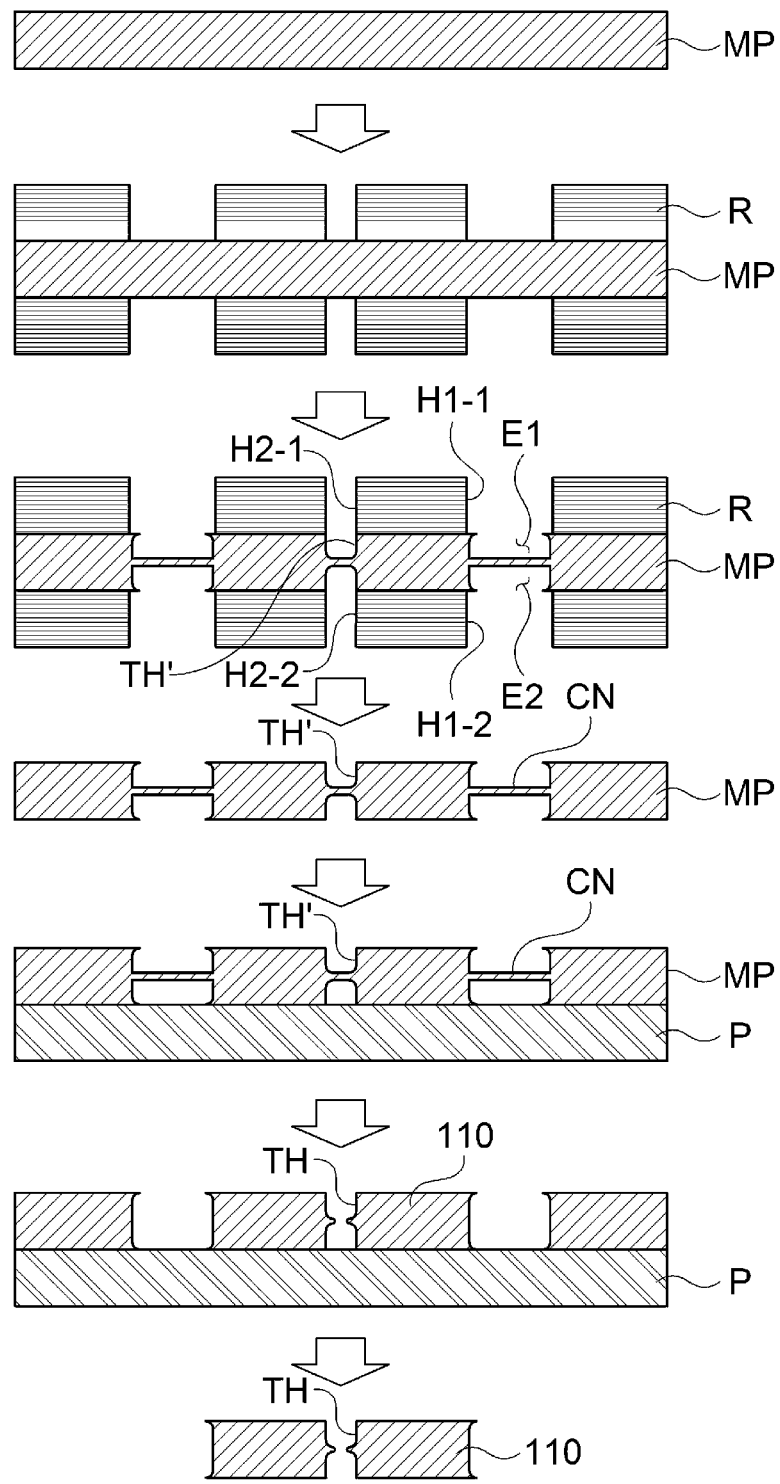
FIG. 6 is a diagram illustrating an example of a method of manufacturing a heat-transfer body.
Figure 7:
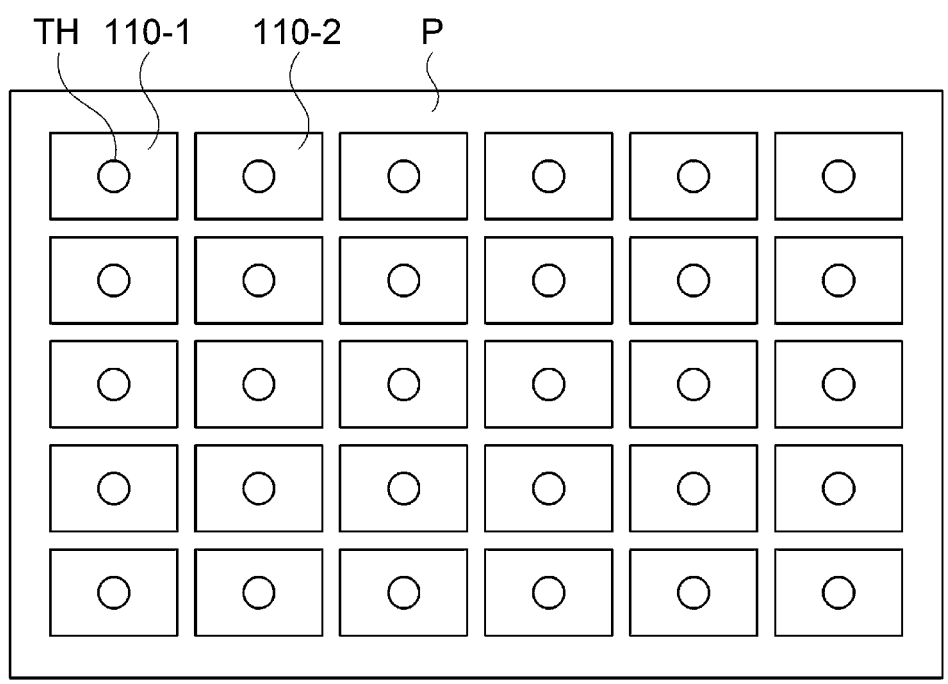
FIG. 7 is a diagram illustrating an example of manufacturing a plurality of heat-transfer bodies.

FIG. 6 illustrates an example of the steps of a method of manufacturing the first heat-transfer body 110, and FIG. 7 illustrates an example of manufacturing a plurality of the first heat-transfer bodies 110. The operations in FIGS. 6-7 may be performed in the sequence and manner as shown, although the order of some operations may be changed or some of the operations omitted without departing from the spirit and scope of the illustrative examples described. Many of the operations shown in FIGS. 6-7 may be performed in parallel or concurrently. The above descriptions of FIGS. 1-5, is also applicable to FIGS. 6-7, and is incorporated herein by reference. Thus, the above description may not be repeated here.

Referring to FIG. 6, a metal plate MP made of a metallic material, such as copper, is prepared. A resist layer R is formed on the metal plate MP. Openings H1-1, H1-2, H2-1, H2-2 are formed by patterning the resist layer R to correspond to a shape of the first heat-transfer body 110, and an etching process is performed to form etching holes E1, E2 and function holes TH'. In this example, if a plurality of first heat-transfer bodies 110 are to be formed using a single metal plate, the etching process is performed until a connecting portion CN remains, for the convenience of follow-up processes. After the resist layer R is removed, the etched metal plate MP is disposed on a separate plate P before removing the connecting portion CN. As a result, the first heat-transfer bodies 110-1, 110-2 each having a function hole TH included therein may be manufactured. As illustrated in FIG. 6, the first heat-transfer body 110 may have a trace of etching remained on a lateral surface. The lateral surface of the first heat-transfer body 110 may be formed in a concave shape that is inwardly led into the first heat-transfer body 110. Moreover, as illustrated, the function hole TH may have a cross section in the shape of an hourglass, as the metal plate MP is etched from above and below.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A circuit board comprising:
   a first insulating layer having a cavity formed therein;
   a circuit pattern disposed on at least one surface of the first insulating layer;
   a heat-transfer body disposed in the cavity, the heat-transfer body comprising a thermally conductive material and formed in a column shape and electrically disconnected from the circuit pattern;
   a second insulating layer covering the first insulating layer and the heat-transfer body;

a function hole penetrating the heat-transfer body between a top surface and a bottom surface of the heat-transfer body;

a first surface of a first via in contact with a top surface of the heat-transfer body;

a first metal pattern in contact with a second surface of the first via; and a first coupling member connected to the first metal pattern, wherein an insulating material is filled in the function hole, and the insulating material is integrally formed with the second insulating layer.

2. The circuit board as set forth in claim 1, wherein the function hole is formed near a center of the heat-transfer body.

3. The circuit board as set forth in claim 1, wherein:
the first coupling member is connectable with a first electronic component; and
the first electronic component comprises a first area and a second area, the second area having a higher temperature than the first area during an operation.

4. The circuit board as set forth in claim 3, wherein at least a portion of the heat-transfer body is placed vertically below the first electronic component.

5. The circuit board as set forth in claim 4, wherein an area of a top surface of the heat-transfer body corresponds to a width of the second area of the first electronic component.

6. The circuit board as set forth in claim 4, further comprising:
a second via having a surface in contact with a bottom surface of the heat-transfer body;
a second metal pattern in contact with another surface of the second via; and
a second coupling member connected to the second metal pattern,
wherein a heat from the heat-transfer body moves to the second coupling member through the second via and the second metal pattern.

7. The circuit board as set forth in claim 1, wherein a primer layer is formed on a surface of the heat-transfer body, the primer layer being configured to adhere the heat-transfer body to the first insulating layer.

8. The circuit board as set forth in claim 1, wherein a primer is formed on a surface of the heat-transfer body, and the first via penetrates the primer to be in contact with the top surface of the heat-transfer body.

* * * * *